Dec. 25, 1962 L. PENSAK 3,070,520

SEMICONDUCTOR DEVICES AND METHODS OF FABRICATING THEM

Filed Dec. 23, 1957

INVENTOR.
LOUIS PENSAK

BY J. L. Whittaker

ATTORNEY

United States Patent Office 3,070,520

Patented Dec. 25, 1962

3,070,520
SEMICONDUCTOR DEVICES AND METHODS OF FABRICATING THEM

Louis Pensak, Princeton, N.J., assignor to Radio Corporation of America, a corporation of Delaware Filed Dec. 23, 1957, Ser. No. 704,463
15 Claims. (Cl. 204—15)

This invention relates to improved semiconductor devices and methods of making them. More particularly, the invention relates to improved methods of reducing the effective spacing between two electrodes of a semiconductor device.

Semiconductor devices such as transistors and crystal rectifiers include a base of semiconductive material, at least one rectifying electrode contacting the base, and a substantially ohmic or non-rectifying connection to the base.

In the art of making semiconductor devices such as transistors, it is known that close spacing of electrodes is desirable in order to reduce the transit time of charge carriers and thus improve performance at high frequencies. Close spacing of electrodes has the additional effect of reducing the recombination of holes and electrons, thereby improving the efficiency of the device. See for example Chapter 1 of "Transistor Electronics," by Lo, Endres, Zawels, Waldhauer and Cheng, Prentice-Hall, Englewood Cliffs, 1955. More important, close spacing of emitter and base electrodes reduces the base resistance, that is, the effective internal resistance between the rectifying emitter electrode and the non-rectifying base electrode. This internal resistance is one of the important limiting parameters in the high frequency operation of the device. Hence, reduction of this resistance by close spacing of the electrodes improves both the efficiency and the high frequency performance of the device. Previous methods of making one electrode closely adjacent to another electrode on a semiconductor have relied primarily on the skill of an individual operator in making a solder connection without short-circuiting the electrode. However, it is difficult to control the separation of the electrodes for very short distances by mechanical means.

Accordingly, an object of the invention is to provide improved semiconductor devices.

Another object of this invention is the provision of an improved method of making improved semiconductor devices.

Still another object of this invention is the provision of a new and improved method of controlling the effective separation between two electrodes of a semiconductor device.

Yet another object of this invention is to provide improved semiconductor devices utilizing bases of either P-type or N-type semiconductor material and being especially adapted for operation at relatively high electrical frequencies.

But another object is to provide improved semiconductor devices comprising semiconductor bodies having rectifying electrodes disposed on selected portions of their surfaces and non-rectifying connections upon other portions of their surfaces closely adjacent to the rectifying electrodes.

These and other objects of the invention are accomplished by fabricating a semiconductor device, such as a transistor, with the electrodes at a convenient large distance apart, then reducing the effective separation of the electrodes by plating a metal over the surface of the device from one electrode to within a desired short distance of the other electrode. This effect is obtained by making one electrode a cathode in a suitable electroplating bath, using a block of the desired plating metal as anode, and maintaining the other electrode at about the same potential as the anode. The potential of the other electrode may range from the anode potential to the minimum plating potential. A conductive coating or film of the metal is thereby plated over the device from the one cathode electrode to within a short distance of the other electrode or electrodes maintained at anode potential.

The invention and its advantages will be described in greater detail with reference to the drawing, wherein.

Similar reference characters are applied to similar elements throughout the drawing.

Figure 1:
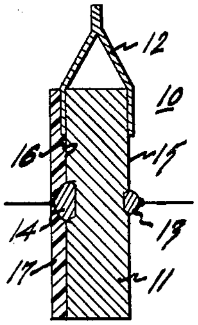
FIGURE 1 is a schematic cross-sectional view of a typical semiconductor device which may be employed in the practice of this invention.

Referring to FIGURE 1, a junction transistor is prepared, for example, by the surface alloy process. The process is described in "A Developmental Germanium PNP Junction Transistor," by Law, Mueller, Pankove and Armstrong, Proceedings IRE, volume 40, November 1952. In this example a transistor 10 of the PNP type is prepared by using N-conductivity type single crystal germanium as the wafer 11, a nickel tab 12 as the ohmic (non-rectifying) base connection soldered to the wafer, and indium as the impurity pellets alloyed to the wafer 11 to make the rectifying emitter electrode 13 and the rectifying collector electrode 14 on opposite surfaces 15 and 16 of the wafer 11. The collector electrode 14 and the collector surface 16 of the wafer 11 are covered with an insulating material 17, for example, nitrocellulose.

Figure 2:
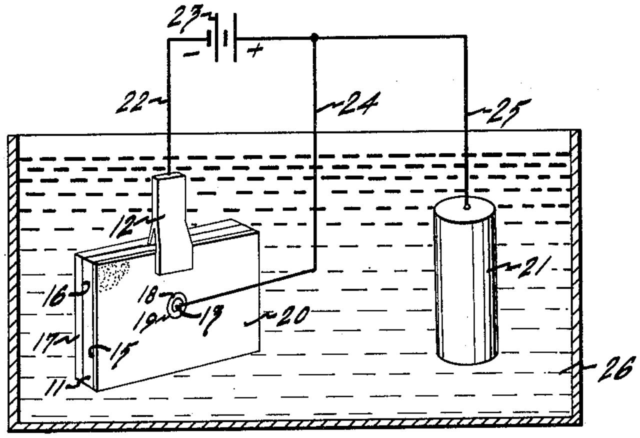
FIGURE 2 is a schematic view of one embodiment of apparatus which may be used in controlling the effective separation between two electrodes of a semiconductor device in accordance with the present invention.

Referring to FIGURE 2, the device 10 is then immersed in a plating bath 26 which contains as the anode 21 a block of the metal which it is desired to plate. A suitable metal for this purpose is tin, although any other conductive metal may be used which plates readily on the semiconductive wafer 11 and does not alter the electrical properties of the wafer.

The composition of the plating bath 26 depends on the metal selected as anode 21. In this example, since tin is to be used as the anode and plating element, a suitable aqueous bath has the following composition:

| | Oz./gal. |
|---|---|
| Sodium hydroxide | 2 |
| Sodium stannate | 20 |
| Sodium acetate | 3 |
| Sodium perborate | 1/16 |
| Water | Balance |

The base tab 12 of the device is made the cathode of the plating bath 26 by attaching it through a lead 22 to the negative terminal of a battery 23. The emitter electrode 13 and the plating anode 21 are attached by leads 24 and 25 respectively to the positive terminal of the battery 23. The emitter electrode 13 is thus maintained at the same potential as the anode 21. The device is immersed in the plating bath 26 for about 10 minutes. The exact time is not critical, and may be varied depending on the geometry and thickness of plating desired. The potential between anode 21 and cathode 12 is maintained by the battery 23 at about ½ to 2 volts during this period. The exact potential between the anode 21 and base tab 12 as cathode is not critical. The composition of the plating bath partly determines the voltage to be used.

A coating or layer of tin 20 will plate out on part of the emitter surface 15 of the device. However, the emitter 13 itself, being electrically connected to the plating bath anode, will receive no plating. Also, because the emitter 13 injects carriers, there will be an IR drop through the wafer. This causes the wafer surface region 18 adjacent to the emitter 13 to be at a potential close to the emitter potential. The region 18 therefore receives no plating, as well as the emiter 13 itself. The unplated base region 18 may be made as small as 1 mil or less. As the wafer potential falls off with increasing distance from the emitter dot 13, it reaches a potential sufficient to cause plating to occur. The remaining wafer surface area beyond the line 19 of minimum plating potential will be entirely plated. The distance between the emitter 13 and the plated area 20 thus becomes the effective distance between the emitter 13 and the base 12, since the plated area 20 connects to the base tab 12. An advantage of this method is that the line of demarcation 19 between the unplated area 18 and the plated area 20 thus made corresponds to the shape of the emitter 13, including its irregularities.

Figure 3:
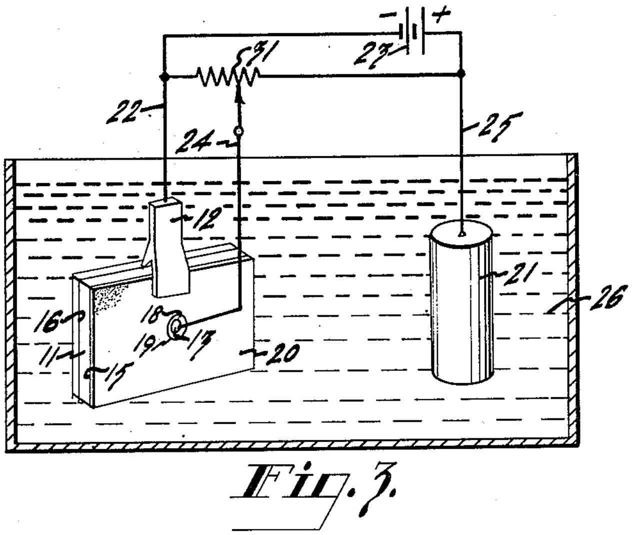
FIGURE 3 is a schematic view of a modification of the apparatus shown in FIGURE 2.

Referring to FIGURE 3, another embodiment of the invention permits accurate control of the size of the unplated region 18. In this form of the invention the cathode lead 22 and the anode lead 25 are connected by a potentiometer 31. The emitter lead 24 is connected to the movable contact of the potentiometer 31 so that the potential of the emitter 13 can be adjusted relative o the potential of the anode 21. The resistance of the potentiometer is made sufficiently low so that the emitter 13 can be held at any potential between the anode potential and the cathode potential even though current may flow between emitter 13 and base tab 12. As the potential of the emitter 13 approaches that of the plating cathode (the base tab 12), the size of the unplated area 18 decreases. The plated area 20 may thus be extended to a distance of 1 mil or less from the emitter. In an NPN transistor, the unplated area 18 becomes the very narrow region of the space charge depletion layer which exists around the emitter electrode. The effective distance between the emitter 13 and the base 12 may thus be reduced to about 0.25 mil. Such short distances for the effective separation of emitter and base would be extremely difficult to obtain by mechanical methods.

After plating, when the insulating material 17 is no longer needed, it may be removed by a suitable solvent. For nitrocellulose, amyl acetate or acetone may be used as the solvent. The method of the invention may be used in any semiconductor device where it is desired to bring about very close spacing of two electrodes. For example, the invention may be used on a diode, in which case coating with an insulating material is not necessary.

Although tin has been used as the plating metal in the example described, many other metals such as silver, lead, cadmium, and gold can be readily used instead. The metal selected should preferably be electrically inert with respect to the particular semiconductor utilized. With some plating metals, such as tin, an additional step of heating the unit to the melting point of the plated metal after plating has been found advantageous in insuring the uniform ohmic contact desired over the entire plated area. For each metal, an appropriate plating bath is used. The composition of such plating baths may be found in "The Metals Reference Book," volume II, p. 924, Interscience Publishers, New York, 1955, and in the "Chemical Engineers Handbook," p. 1798, McGraw-Hill, New York, 1950. The surface alloyed PNP germanium junction transistor has been described only as an example and not as a limitation, and the invention is equally applicable to all solid semiconductor devices having at least two electrodes, including devices made of such solid semiconductors as, for example, silicon, gallium arsenide, and indium phosphide.

Figure 4:
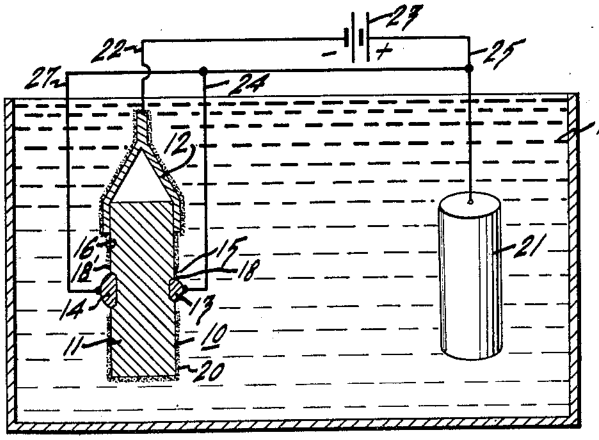
FIGURE 4 is a schematic view of another modification of the apparatus shown in FIGURE 2.

Referring to FIGURE 4, another modification of this invention is shown in which the emitter electrode 13 and the collector electrode 14 are both connected by leads 24 and 27 respectively to the positive terminal of the battery 23, so that both are maintained at about the same potential as the anode 21. In this modification both the emitter surface 15 and the collector surface 16 are covered with a plating 20 of the anode metal, except for a small region 18 around the emitter 13, and a similar region 18' around the collector 14. The protective insulating coating 17 may be omitted in this arrangement. Other modifications may be made without departing from the spirit and scope of this invention.

There have thus been described improved methods for controlling the effective separation of electrodes in semiconductor devices. There have also been described improved transistors, diodes, and similar devices.

What is claimed is:

1. A method of making a semiconductor device including a base of semiconductive material and at least two electrodes in contact with said base, comprising the steps of immersing said device in a plating bath containing a metal anode, connecting one said electrode to said anode so as to maintain said one electrode at a potential which is between the anode potential and the minimum plating potential, connecting the other said electrode as the cathode of said plating bath, applying an electroplating potential between said metal anode and said device thereby to deposit a coating of said metal over the surface of said device except said one electrode and a region immediately around it which was maintained below said minimum plating potential.

2. A method of making a semiconductor device including a base of semiconductive material and at least two electrodes in contact with said base, comprising the steps of immersing said device in a plating bath containing a metal anode, said metal being one which forms a non-rectifying contact when plated on said semiconductive material, connecting one said electrode to said anode so as to maintain said one electrode at a potential which is between the anode potential and the minimum plating potential, connecting the other said electrode as the cathode of said plating bath, applying an electroplating potential between said metal anode and said device thereby to deposit a coating of said metal over the surface of said device except said one electrode and a region immediately around it which was maintained below said minimum plating potential.

3. A method of making a semiconductor device including a base of semiconductive material and at least two electrodes in contact with said base, comprising the steps of immersing said device in a plating bath containing a metal anode, said metal being one which forms a non-rectifying contact when plated on said semiconductive material, connecting one said electrode to said anode so as to maintain said one electrode at a potential which is between the anode potential and the minimum plating potential, connecting the other said electrode as the cathode of said plating bath, applying an electroplating potential between said metal anode and said device thereby to deposit a coating of said metal over the surface of said device except said one electrode and a region immediately around it which was maintained below said minimum plating potential, and subsequently heating said device to diffuse a portion of said deposited metal coating into said device.

4. A method of making a transistor including a body of semiconductive material, a rectifying emitter electrode, a rectifying collector electrode, and a non-rectifying base electrode, comprising the steps of coating said collector electrode and the adjacent surface of said body with an insulating coating, immersing said body in a plating bath containing a metal anode, said metal being one which forms a non-rectifying contact when plated on said semiconductive material, connecting said emitter electrode to said metal anode so as to maintain said emitter electrode at substantially the same potential as said anode, connecting said base electrode to the cathode of said bath, applying an electroplating potential between said metal anode and said base electrode thereby to deposit a film of said metal over the surface of said body except the portion covered with said insulating material and the portion including said emitter electrode and the immediately adjacent region which was maintained at substantially the anode potential.

5. A method of making a transistor including a body of semiconductive material, a rectifying emitter electrode, a rectifying collector electrode, and a non-rectifying base electrode, comprising the steps of coating said collector electrode and the adjacent surface of said body with an insulating coating, immersing said body in a plating bath containing a metal anode, said metal being one which forms a non-rectifying contact when plated on said semiconductive material, connecting said emitter electrode to said metal anode so as to maintain said emitter at a potential which is between the anode potential and the minimum plating potential, connecting said base electrode as the cathode of said bath, applying an electroplating potential between said metal anode and said base electrode thereby to deposit a film of said metal over the surface of said body except the portion covered with said insulating material and the portion including the emitter and the immediately adjacent region which was maintained below said minimum plating potential.

6. A method of making a transistor including a body of semiconductive material, a rectifying emitter electrode, a rectifying collector electrode, and a non-rectifying base electrode, comprising the steps of coating said collector electrode and the adjacent surface of said body with an insulating coating, immersing said body in a plating bath containing a metal anode, said metal being one which forms a non-rectifying contact when plated on said semiconductive material, connecting said emitter electrode to said metal anode so as to maintain said emitter at a potential which is between the anode potential and the minimum plating potential, connecting said base electrode as the cathode of said bath, applying an electroplating potential between said metal anode and said base electrode thereby to deposit a film of said metal over the surface of said body except the portion covered with said insulating material and the portion including the emitter and the immediately adjacent region which was maintained below said minimum plating potential, and subsequently removing said insulating coating.

7. In the manufacture of a semiconductor device of the type comprising a body of semiconducting material and two electrodes connected thereto at a distance apart which is larger than that ultimately desired, the method of reducing the effective separation of said electrodes comprising immersing said device in an electroplating bath with a metal anode, connecting one of said electrodes as the cathode of said bath, connecting the other of said electrodes to said metal anode, maintaining the other of said electrodes at a potential which is between the anode potential and the minimum plating potential, and plating the metal of said anode over the surface of the device except for a small region immediately around said other electrode.

8. The method as in claim 7, in which the anode metal is tin.

9. In the manufacture of junction transistors by the surface alloy process including placing an impurity pellet on one surface of a solid monocrystalline semiconductor wafer to form the emitter, another impurity pellet on the opposite surface to form the collector, a base tab on another portion of the said emitter surface, and heating until both said pellets and said base tab are alloyed into said wafer, the improvement consisting of coating the collector surface of the wafer with an insulating material, immersing the wafer in an electroplating bath containing a metal anode, connecting said base tab as the cathode of the bath, connecting said emitter pellet to said metal anode, and maintaining said emitter pellet at a potential which is between the anode potential and the minimum plating potential, so that said emitter surface will be plated by said metal except for that region immediately around said emitter pellet where the potential is not sufficiently negative to permit plating.

10. The method as in claim 9, in which the semiconductor wafer is N-type germanium.

11. The method as in claim 10, in which the impurity pellet is indium.

12. The method as in claim 11, in which the base tab is nickel.

13. The method as in claim 12, in which the metal anode is silver.

14. In the manufacture of junction transistors including emitter, collector and base electrodes, the improvement consisting of connecting together said emitter and collector electrodes, immersing the device in a plating bath containing a metal anode, connecting said base electrode as the cathode of the bath, connecting said emitter and collector electrodes to said metal anode, and maintaining the emitter and collector electrodes at a potential between the anode potential and the minimum plating potential, so that the surface of the device will be plated except for a region immediately around the said emitter and collector electrodes where the potential is not sufficiently negative to permit plating.

15. The method as in claim 14, in which the anode metal is gold.

References Cited in the file of this patent

UNITED STATES PATENTS

| | | |
|---|---|---|
| 2,656,496 | Sparks | Oct. 20, 1953 |
| 2,669,692 | Pearson | Feb. 16, 1954 |
| 2,694,040 | Davis et al. | Nov. 9, 1954 |
| 2,695,930 | Wallace et al. | Nov. 30, 1954 |
| 2,823,175 | Roschen | Feb. 11, 1958 |
| 2,846,346 | Bradley | Aug. 5, 1958 |
| 2,893,929 | Schnable | July 7, 1959 |
| 2,912,371 | Early | Nov. 10, 1959 |